United States Patent
Hsu

(10) Patent No.: US 9,581,986 B2
(45) Date of Patent: Feb. 28, 2017

(54) INPUT DEVICE PROVIDING CONTROL INFORMATION TO HOST DEVICE

(71) Applicant: Nuvoton Technology Corporation, Hsinchu Science Park (TW)

(72) Inventor: Keng Hao Hsu, Zhudong Township, Hsinchu County (TW)

(73) Assignee: Nuvoton Technology Corporation, Hsinchu Science Park (TW)

( * ) Notice: Subject to any disclaimer, the term of this patent is extended or adjusted under 35 U.S.C. 154(b) by 423 days.

(21) Appl. No.: 14/195,166

(22) Filed: Mar. 3, 2014

(65) Prior Publication Data

US 2015/0057772 A1    Feb. 26, 2015

(30) Foreign Application Priority Data

Aug. 23, 2013  (TW) .............................. 102130178 A

(51) Int. Cl.
| | |
|---|---|
| G05B 15/00 | (2006.01) |
| G05B 15/02 | (2006.01) |
| G06F 3/023 | (2006.01) |
| H03M 11/10 | (2006.01) |
| H03M 11/20 | (2006.01) |

(52) U.S. Cl.
CPC ............. *G05B 15/02* (2013.01); *G06F 3/023* (2013.01); *H03M 11/10* (2013.01); *H03M 11/20* (2013.01)

(58) Field of Classification Search
CPC ..................................................... G05B 15/02
See application file for complete search history.

(56) References Cited

U.S. PATENT DOCUMENTS

| | | | |
|---|---|---|---|
| 7,128,270 B2 | 10/2006 | Silverbrook et al. | |
| 2005/0159126 A1* | 7/2005 | Wang ..................... | H03M 11/24 455/226.4 |
| 2008/0198044 A1* | 8/2008 | Liu ........................ | G06F 3/023 341/26 |
| 2011/0122001 A1 | 5/2011 | Huang et al. | |
| 2012/0050208 A1* | 3/2012 | Dietz .................... | G06F 3/0416 345/174 |
| 2012/0262376 A1* | 10/2012 | Li .......................... | H03M 11/20 345/168 |

FOREIGN PATENT DOCUMENTS

| | | |
|---|---|---|
| JP | 06-161627 | 6/1994 |
| TW | 200517966 | 6/2005 |
| TW | M419144 U1 | 12/2011 |
| TW | 201205620 A1 | 2/2012 |

OTHER PUBLICATIONS

Office Action and Search Report issued on Apr. 24, 2015 in corresponding TW patent application No. 102130178 (10 pages).

* cited by examiner

*Primary Examiner* — Philip Wang
(74) *Attorney, Agent, or Firm* — Muncy, Geissler, Olds & Lowe, P.C.

(57) ABSTRACT

An input device provides control information to a host device and including a plurality of keys, a division module and a control module is disclosed. When an object presses a specific key, the specific key generates a resistance value according to a force applied by the object. The division module receives the resistance value and generates a voltage level according to the resistance value and a first level. The control module generates the control information according to the voltage level. The host device executes a function corresponding to the specific key according to the control information.

18 Claims, 7 Drawing Sheets

– 1 –
INPUT DEVICE PROVIDING CONTROL INFORMATION TO HOST DEVICE

CROSS REFERENCE TO RELATED APPLICATIONS

This Application claims priority of Taiwan Patent Application No. 102130178, filed on Aug. 23, 2013, the entirety of which is incorporated by reference herein.

BACKGROUND OF THE INVENTION

Field of the Invention

The invention relates to an input device, and more particularly to an input device including a plurality of keys.

Description of the Related Art

Generally, when a user utilizes a keyboard to input text, if the text displayed on the monitor is not the same as the input text, this phenomenon is referred to as a ghost key phenomenon. To avoid the ghost key phenomenon, a conventional method disposes a plurality of diodes in the keyboard. Each diode is coupled to a key. Another conventional method considers the habits of the users to design the circuit layout of the keyboard. However, the conventional method increases the cost of components and the circuit complexity of the keyboard.

BRIEF SUMMARY OF THE INVENTION

In accordance with an embodiment, an input device provides control information to a host device and includes a plurality of keys, a division module and a control module. When an object presses a specific key, the specific key generates a resistance value according to a force applied by the object. The division module receives the resistance value and generates a voltage level according to the resistance value and a first level. The control module generates the control information according to the voltage level and provides the control information to the host device to execute a function corresponding to the specific key according to the control information.

In accordance with another embodiment, a control unit is coupled between a keyboard and a host device. The keyboard includes a plurality of keys. When an object presses a specific key among the keys, the specific key generates a resistance value according to a force applied by the object. The control unit includes a division module and a control module. The division module generates a voltage level according to the resistance value and a first level. The control module receives the voltage level to generate control information and provides the control information to the host device to execute a function corresponding to the specific key according to the control information.

A detailed description is given in the following embodiments with reference to the accompanying drawings.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

Figure 1:
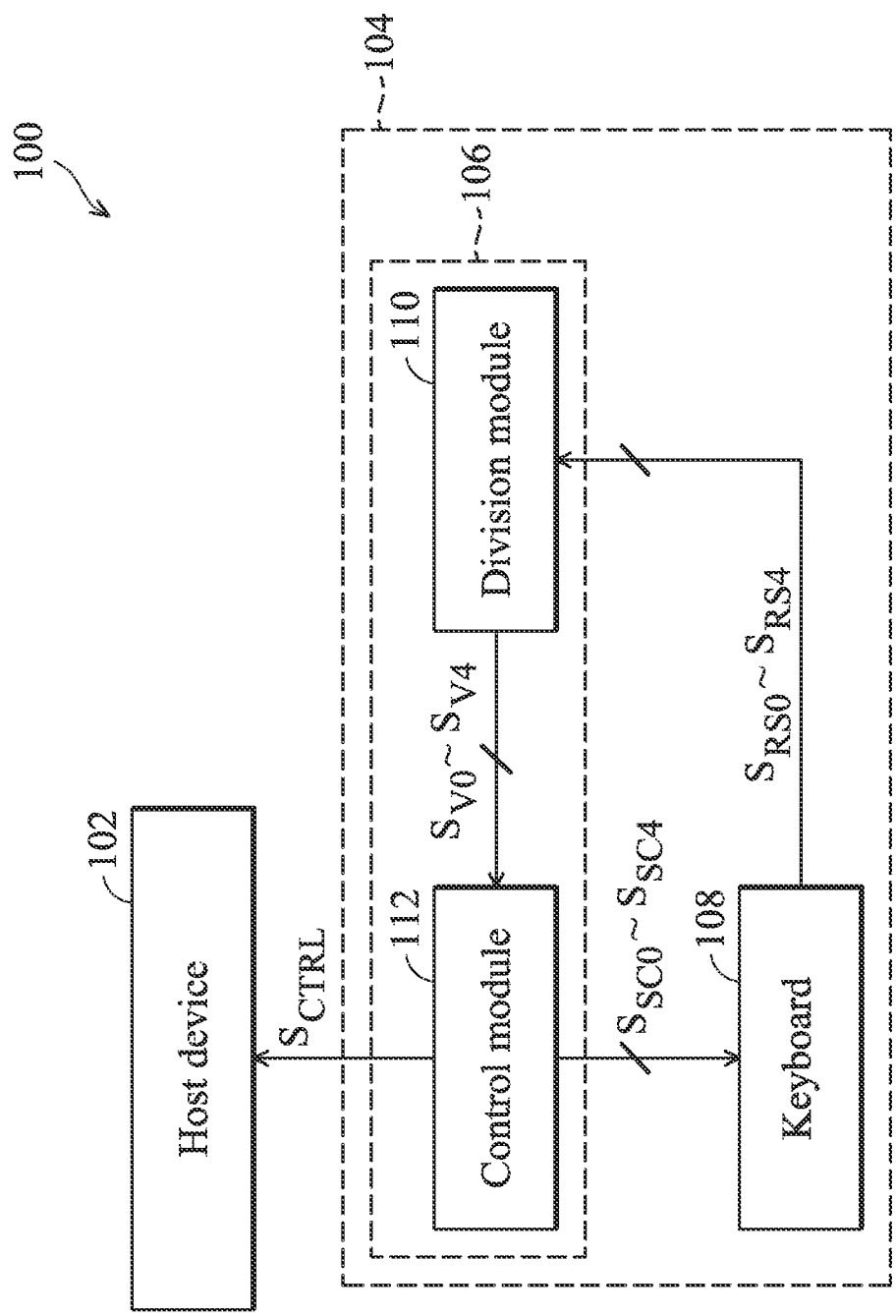
FIG. 1 is a schematic diagram of an exemplary embodiment of a control system.

FIG. 1 is a schematic diagram of an exemplary embodiment of a control system. The control system 100 includes a host device 102 and an input device 104. The invention does not limit the kind of host device 102. Any device can serve as the host device 102, as long as the device is capable of executing operation functions. In one embodiment, the host device 102 can be a tablet personal computer, a desktop computer or another mobile electronic device.

The input device 104 provides control information $S_{CTRL}$ to the host device 102. The host device 102 operates according to the control information $S_{CTRL}$. In some embodiments, the host device 102 executes a corresponding application program or displays a corresponding image or text. In this embodiment, the input device 104 includes a control unit 106 and a keyboard 108.

The control unit 106 is configured to determine whether at least one key of the keyboard 108 is pressed and determine which key is pressed. In one embodiment, the control unit 106 is integrated in the keyboard 108 or the host device 102. In other embodiments, the control unit 106 is disposed outside of the keyboard 108 or outside of the host device 102.

The control unit 106 includes a division module 110 and a control module 112. In one embodiment, the division module 110 and the control module 112 are integrated into a chip. The host device 102 communicates with the keyboard 108 via the chip. In this case, the chip including the division module 110 and the control module 112 can be integrated in the keyboard 108 or disposed outside the keyboard 108. In other embodiments, the division module 110 is integrated in the keyboard 108 and the control module 112 is disposed outside the keyboard 108.

Figure 2:
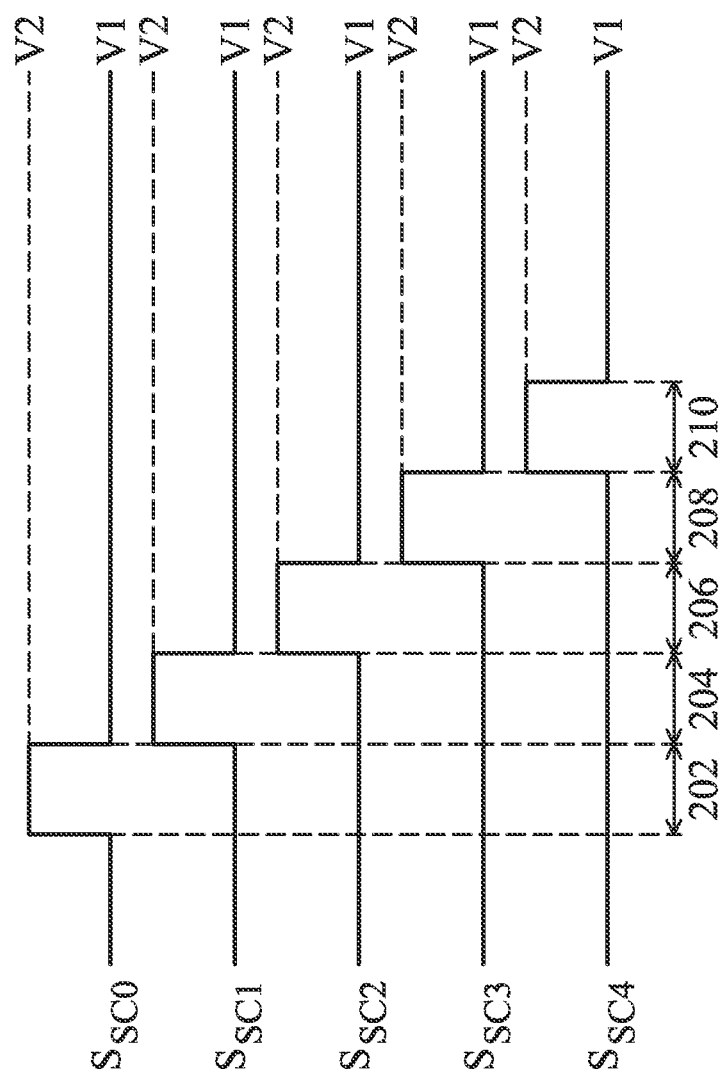
FIG. 2 is a schematic diagram of an exemplary embodiment of scan signals.

The control module 112 provides a plurality of scan signals to detect whether a key is pressed on the keyboard 108. For clarity, FIG. 1 only shows scan signals $S_{SC0} \sim S_{SC4}$, but the disclosed is not limited thereto. In this embodiment, the number of scan signals relates to the number of keys on the keyboard 108 and the arrangement of the keys of the keyboard 108. In other embodiments, the control module 112 provides a plurality of scan signals to the keyboard 108. FIG. 2 is a schematic diagram of an exemplary embodiment of the scan signals $S_{SC0} \sim S_{SC4}$. In this embodiment, the levels of the scan signals $S_{SC0} \sim S_{SC4}$ are between the levels V1 and V2. The level V2 exceeds the level V1. In one embodiment, the level V1 is a ground level, such as 0V. In some embodiments, the levels V1 and V2 are operation voltages of the control module 112.

In this embodiment, when one scan signal is at a high level, other scan signals are at a low level. For example, during a period 202, the control module 112 sets the level of the scan signal $S_{SC0}$ at the level V2 and sets the levels of the scan signals $S_{SC1} \sim S_{SC4}$ at the level V1. During a period 204, the control module 112 sets the level of the scan signal $S_{SC1}$ at the level V2 and sets the levels of the scan signals $S_{SC0}$ and $S_{SC2} \sim S_{SC4}$ at the level V1. During a period 206, the control module 112 sets the level of the scan signal $S_{SC2}$ at the level V2 and sets the levels of the scan signals $S_{SC0} \sim S_{SC1}$ and $S_{SC3} \sim S_{SC4}$ at the level V1. During a period 208, the control module 112 sets the level of the scan signal $S_{SC3}$ at the level V2 and sets the levels of the scan signals $S_{SC0} \sim S_{SC2}$ and $S_{SC4}$ at the level V1. During a period 210, the control module 112 sets the level of the scan signal $S_{SC4}$ at the level V2 and sets the levels of the scan signals $S_{SC0} \sim S_{SC3}$ at the level V1.

Refer to FIG. 1, in this embodiment, the keyboard 108 is a resistance-type keyboard. Each key of the resistance-type keyboard is a variable resistor. When one key of the keyboard 108 is pressed, the pressed key generates a corresponding resistance value. The division module 110 is coupled to the keyboard 108 and transforms the resistance value into a voltage level. For clarity, FIG. 1 only shows resistance values $S_{RS0} \sim S_{RS4}$. Therefore, the division module 110 generates the voltage levels $S_{V0} \sim S_{V4}$.

The division module 110 receives the resistance values $S_{RS0} \sim S_{RS4}$ and generates the voltage levels $S_{V0} \sim S_{V4}$ according to the resistance values $S_{RS0} \sim S_{RS4}$ and the level V1. In one embodiment, the division module 110 is serially connected to each variable resistor to divide the corresponding scan signal and provide the divided result to the control module 112. The control module 112 determines which key is pressed according to the voltage levels $S_{V0} \sim S_{V4}$ and outputs the control information $S_{CRTL}$ according to the determined result. The host device 102 executes a function corresponding to the pressed key according to the control information $S_{CRTL}$. In one embodiment, the host device 102 displays a text corresponding to the pressed key or executes an application program corresponding to the pressed key.

Figure 3:
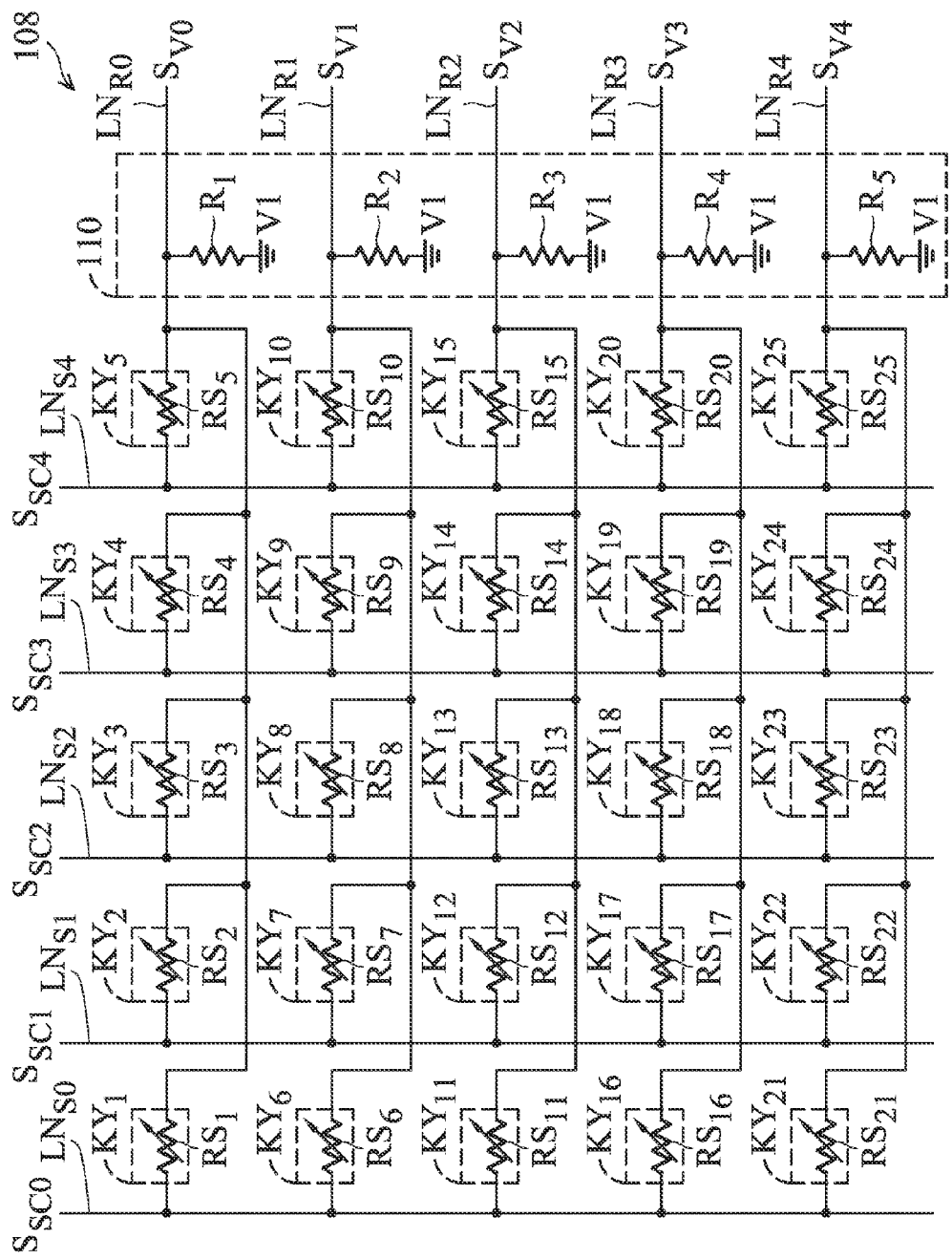
FIG. 3 is a schematic diagram of an exemplary embodiment of a keyboard.

FIG. 3 is a schematic diagram of an exemplary embodiment of a keyboard. In this embodiment, the keyboard 108 includes various entity keys. Since the keyboard 108 is a resistance-type keyboard, when an object, such as a finger or a touch pen, presses one key of the keyboard 108, the pressed key generates a resistance value corresponding to the force applied by the object. In one embodiment, when the force is heavy, the resistance value generated by the pressed key is slight. The invention does not limit the number and the arrangement of the keys of the keyboard 108. For clarity, only keys $KY_1 \sim KY_{25}$ are shown in FIG. 3. The keys $KY_1 \sim KY_{25}$ are arranged in a matrix.

When an object presses one key of the keys $KY_1 \sim KY_{25}$, the pressed key generates a resistance value according to the force applied by the object. In one embodiment, the resistance value generated by the key may be near to 1KΩ. In another embodiment, when the force applied by the object is maximum, the resistance value generated by the key does not equal 0Ω. Therefore, the ghost key phenomenon is avoided. Additionally, when the keys $KY_1 \sim KY_{25}$ are not pressed, the resistance values generated by the keys $KY_1 \sim KY_{25}$ are maximum. In one embodiment, when one of the keys $KY_1 \sim KY_{25}$ is not pressed, the keys $KY_1 \sim KY_{25}$ are referred to as open loops.

In this embodiment, the keyboard 108 includes scan lines $LN_{S0} \sim KN_{S4}$ and receiving lines $LN_{R0} \sim LN_{R4}$. The scan lines $LN_{S0} \sim KN_{S4}$ are successively arranged and extended in a vertical direction. The receiving lines $LN_{R0} \sim LN_{R4}$ are successively arranged and extended in a horizontal direction. The scan lines $LN_{S0} \sim KN_{S4}$ interlace the receiving lines $LN_{R0} \sim LN_{R4}$. Each key is coupled to a corresponding scan line and a corresponding receiving line. For example, the key $KY_1$ is coupled to the scan line $LN_{S0}$ and the receiving line $LN_{R0}$, and the key $KY_3$ is coupled to the scan line $LN_{S2}$ and the receiving line $LN_{R0}$.

Since the keyboard 108 is a resistance-type keyboard, the keys $KY_1 \sim KY_{25}$ are equivalent to variable resistors $RS_1 \sim RS_{25}$. In this embodiment, the division module 110 is integrated in the keyboard 108. In some embodiments, the division module 110 is disposed outside of the keyboard 108. The invention does not limit the circuit structure of the division module 110. Any circuit structure can serve as the division module 110, as long as the circuit structure is capable of transforming a resistance value into a voltage level. Additionally, the division module 110 is replaced by a transforming module (not shown) to transform the resistance values provided by the keyboard 108 into other signals, such as current signals or magnetic signals.

In this embodiment, the division module 110 includes resistance elements $R_1 \sim R_5$. The resistance elements $R_1 \sim R_5$ are serially connected to the variable resistors $RS_1 \sim RS_{25}$ between the scan signals $S_{SC0} \sim S_{SC4}$ and the level V1. For example, the resistance element $R_1$ is serially connected to the variable resistor $RS_1$ between the scan signal $S_{SC0}$ and the level V1. The resistance element $R_2$ is connected to the variable resistor $RS_1$ in series between the scan signal $S_{SC1}$ and the level V1. The division module 110 generates the corresponding voltage levels according to the resistance values of the variable resistors $RS_1 \sim RS_5$ and then outputs the voltage levels to the control module 112 via the receiving lines $LN_{R0} \sim LN_{R4}$.

Figure 4A:
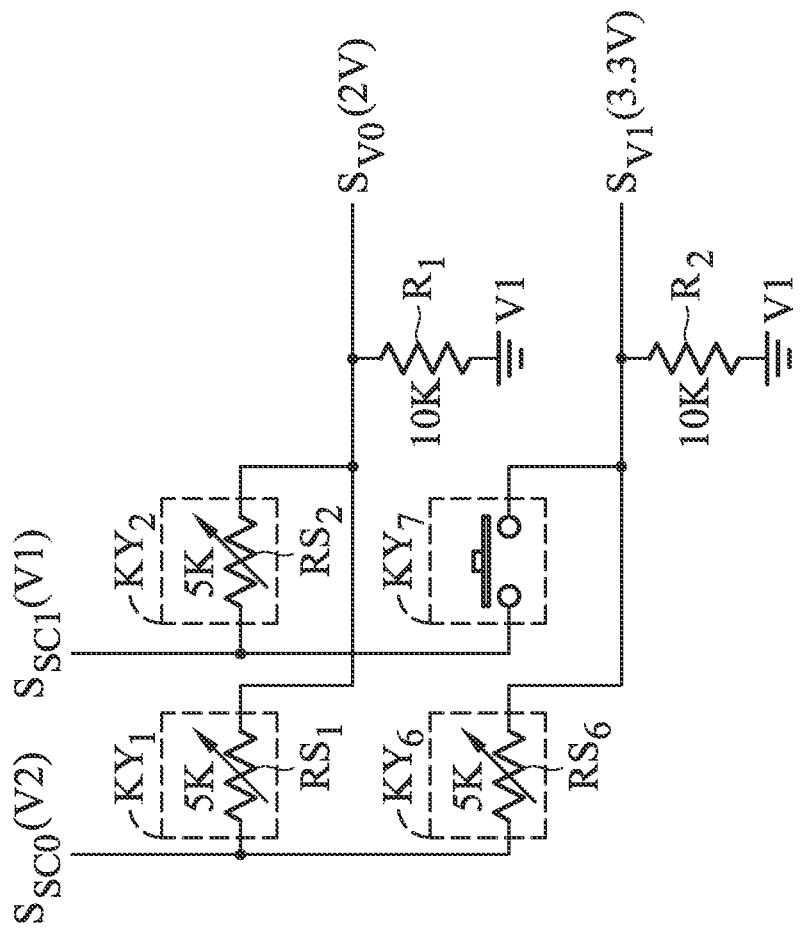
FIGS. 4A and 4B are shown to describe how the division module generates the voltage levels.
Figure 4B:
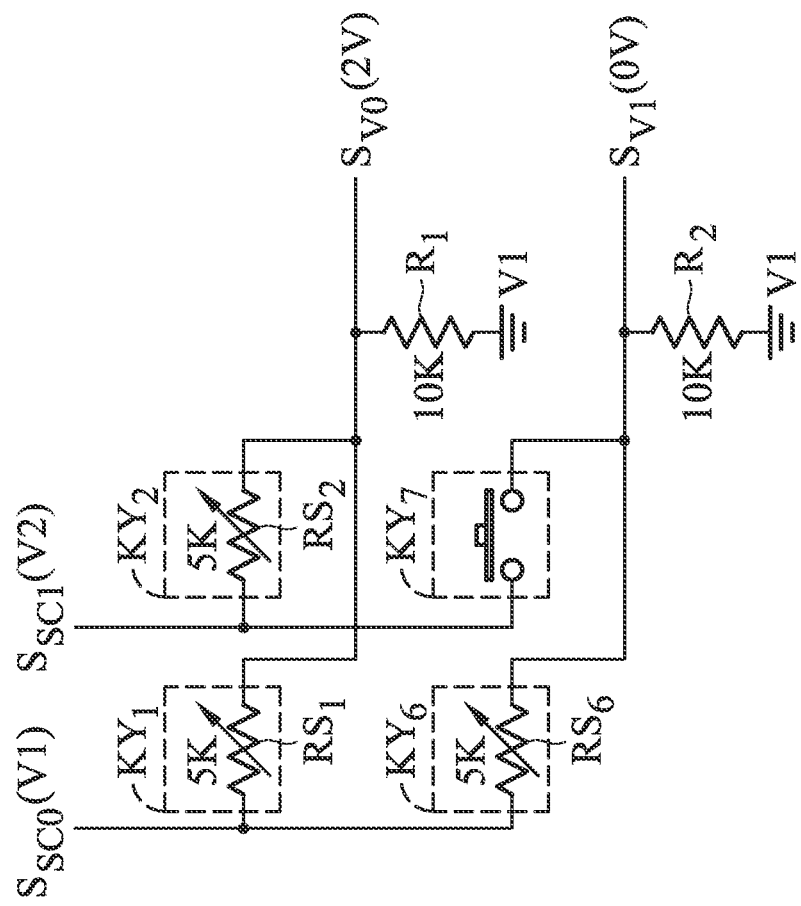

FIGS. 4A and 4B are shown to describe how the division module 110 generates the voltage levels. For clarity, FIGS. 4A and 4B only show keys $KY_1$, $KY_2$, $KY_6$ and $KY_7$. Assume that the keys $KY_1$, $KY_2$ and $KY_6$ are pressed and the key $KY_7$ is not pressed. Refer to FIG. 4A, the control module 112 sets the level of the scan signal $S_{SC0}$ at the level V2, such as 5V, and sets the level of the scan signal $S_{SC1}$ at the level V1, such as 0V, during a first period. During the first period, the variable resistor $RS_2$ is connected to the resistance element R1 in parallel and connected to the variable resistor $RS_1$ in series between the levels V2 and V1. Therefore, the voltage level $S_{V0}$ is expressed by the following equation (1):

$$S_{V0} = \frac{\frac{RS_2 \times R_1}{RS_2 + R_1}}{RS_1 + \frac{RS_2 \times R_1}{RS_2 + R_1}} \times 5 \text{ V} = 2 \text{ V} \quad (1)$$

Furthermore, the variable resistor $RS_6$ is connected to the resistance element $R_2$ in series between the levels V2 and V1. Therefore, the voltage level $S_{V1}$ is expressed by the following equation (2):

$$S_{V1} = \frac{R_2}{RS_6 + R_2} \times 5 \text{ V} = 3.33 \text{ V} \quad (2)$$

Refer to FIG. 1, the control module 112 compares the voltage level $S_{V0}$ with a pre-determined value and compares the voltage level $S_{V1}$ with the pre-determined value. Assume that the pre-determined value is 1V. Since the voltage levels $S_{V0}$ and $S_{V1}$ both exceed the pre-determined value, the control module 112 determines that the key $KY_1$ and the $KY_6$ are valid and outputs two control information $S_{CRTL}$ to the host device 102 according to the voltage levels $S_{V0}$ and $S_{V1}$. The invention does not limit the method of outputting the control information $S_{CRTL}$. In one embodiment, the control module 112 utilizes a serial transmission method or a parallel transmission method to output two control information.

Refer to FIG. 4B, the control module 112 sets the scan signal $S_{SC0}$ at the level V1, such as 0V and sets the scan signal $S_{SC1}$ at the level V2, such as 5V, during a second period. During the second period, the variable resistor $RS_1$ is connected to the resistance element $R_1$ in parallel and connected to the variable resistor $RS_2$ in series between the levels V2 and V1. Therefore, the voltage level $S_{V0}$ is expressed by the following equation (3):

$$S_{V0} = \frac{\frac{RS_1 \times R_1}{RS_1 + R_1}}{RS_2 + \frac{RS_1 \times R_1}{RS_1 + R_1}} \times 5 \text{ V} = 2 \text{ V} \quad (3)$$

Additionally, since the key $KY_7$ is open, the variable resistor $RS_6$ is connected to the resistance element $R_2$ in series and receives the level V1. Therefore, the voltage level $S_{V1}$ is 0V.

Refer to FIG. 1, the control module 112 compares the voltage levels $S_{V0}$, $S_{V1}$ with the pre-determined value. Since the voltage level $S_{V0}$ exceeds the pre-determined value, the control module 112 determines that the key $KY_2$ is valid and outputs the control information $S_{CRTL}$ to the host device 102 according to the voltage level $S_{V0}$. However, since the voltage level $S_{V1}$ is less than the pre-determined value, the control module 112 determines that the key $KY_7$ is invalid. In one embodiment, the control module 112 does not consider the voltage level $S_{V1}$ to output any control information to the host device 102. Therefore, the control module 102 does not execute any function corresponding to the key $KY_7$.

In one embodiment, when a user applies different forces to press the keys, the keys generate different resistance values according to the different forces. Therefore, the host device 102 executes different functions according to the different forces. For example, when the host device 102 executes an automobile-race game, if the force applied by the user is large, the host device 102 executes an accelerate speed function. On the contrary, if the force is small, the host device 102 executes a decelerate speed function.

Furthermore, when various keys are pressed, the division module 110 generates corresponding voltage levels according to various resistance values. The control module 112 generates at least one control information according to the corresponding voltage levels. The host device 102 executes at least one function corresponding to the pressed keys according to the control information. For example, when the key Ctrl, Alt and Delete are pressed, the host device 102 executes a specific function, such as a rebooting operation or a stop operation.

Figure 5:
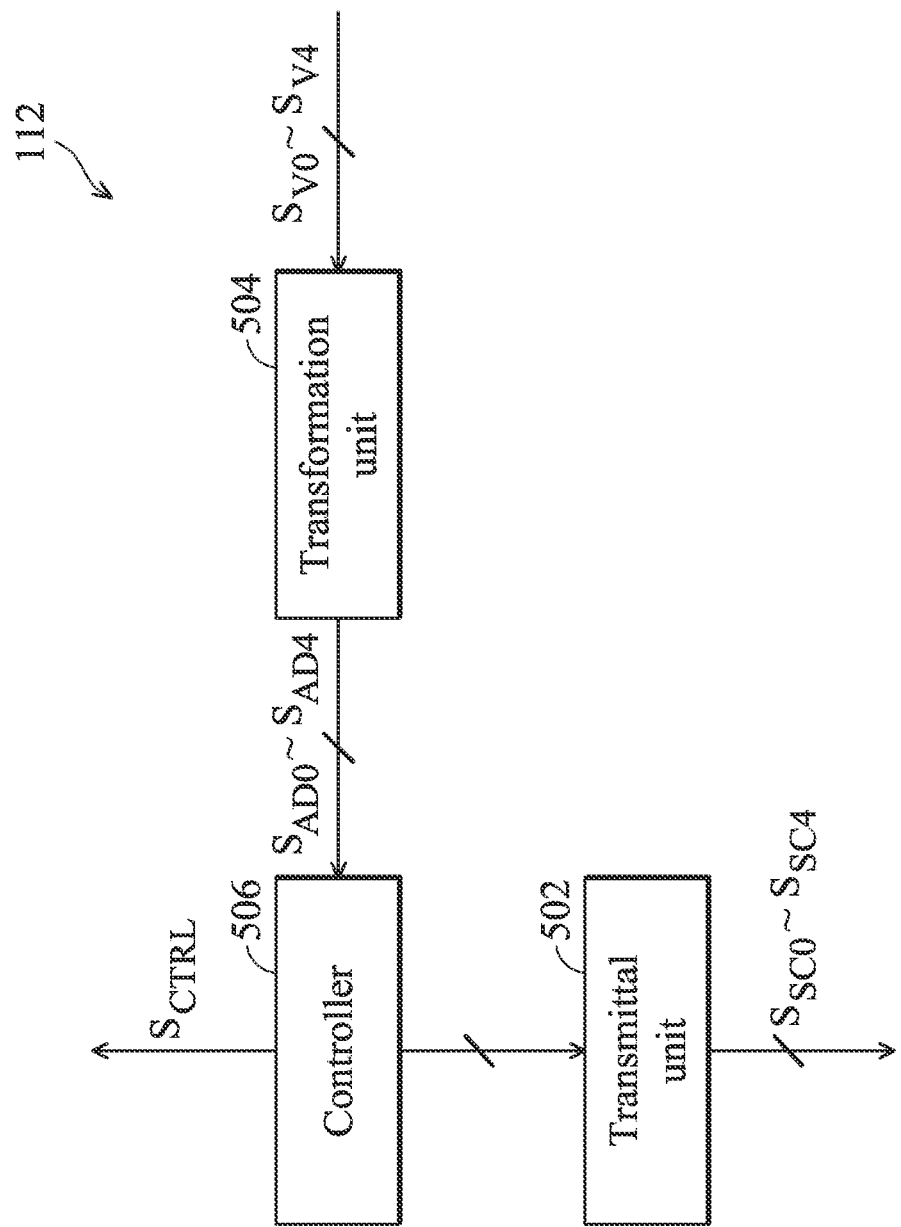
FIG. 5 is a schematic diagram of an exemplary embodiment of a control module.

The invention does not limit the circuit structure of the control module 112. Any circuit structure can serve as the control module 112, as long as the circuit structure is capable of setting the levels of the scan lines of the keyboard 108 successively and is capable of determining which keys are pressed according to the resistance values generated by the keyboard 108. In one embodiment, the control module 112 includes various micro-processors, micro-controllers, registers, memories and logic circuits. FIG. 5 is a schematic diagram of an exemplary embodiment of a control module. The control module 112 includes a transmittal unit 502, a transformation unit 504 and a controller 506.

The transmittal unit 502 includes various pins (not shown) to couple the scan lines $LN_{S0}$~$LN_{S4}$ of the keyboard 108 and transmits scan signals $S_{SC0}$~$S_{SC4}$ to the keyboard 108. In one embodiment, the transmittal unit 502 is a general purpose input/output (GPIO).

The transformation unit 504 transforms the voltage levels $S_{V0}$~$S_{V4}$ to generate digital signals $S_{AD0}$~$S_{AD4}$. In one embodiment, the transformation unit 504 is an analog-to-digital converter (ADC) to transform the voltage levels $S_{V0}$~$S_{V4}$ from an analog format into a digital format, such as the digital signals $S_{AD0}$~$S_{AD4}$.

The controller 506 controls the levels of the pins of the transmittal unit 502 to set the levels of the scan lines $LN_{S0}$~$LN_{S4}$ of the keyboard 108 successively. In this embodiment, the controller 506 sets the level of one pin of the transmittal unit 502 at a high level, such as the level V2. At the same time, the controller 506 sets the levels of other pins of the transmittal unit 502 at a ground level, such as the level V1. In one embodiment, the levels V1 and V2 are provided by an external device (not shown). The controller 506 operates according to the levels V1 and V2.

Additionally, the controller 506 compares the digital signals $S_{AD0}$~$S_{AD4}$ with a pre-determined value to determine which key is pressed. For example, when the digital signal $S_{AD0}$ exceeds the pre-determined value, the controller 506 generates control information $S_{CRTL}$ according to the digital signal $S_{AD0}$. When the digital signal $S_{AD0}$ does not exceed the pre-determined value, the controller 506 does not consider the digital signal $S_{AD0}$ to generate the control information $S_{CRTL}$.

In one embodiment, the controller 506 collects various compared results and integrates the compared results into a single control information to the host device 102. In another embodiment, the controller 506 generates various control information according to various compared results and utilizes a serial transmission method or a parallel transmission method to output the various control information.

Figure 6:
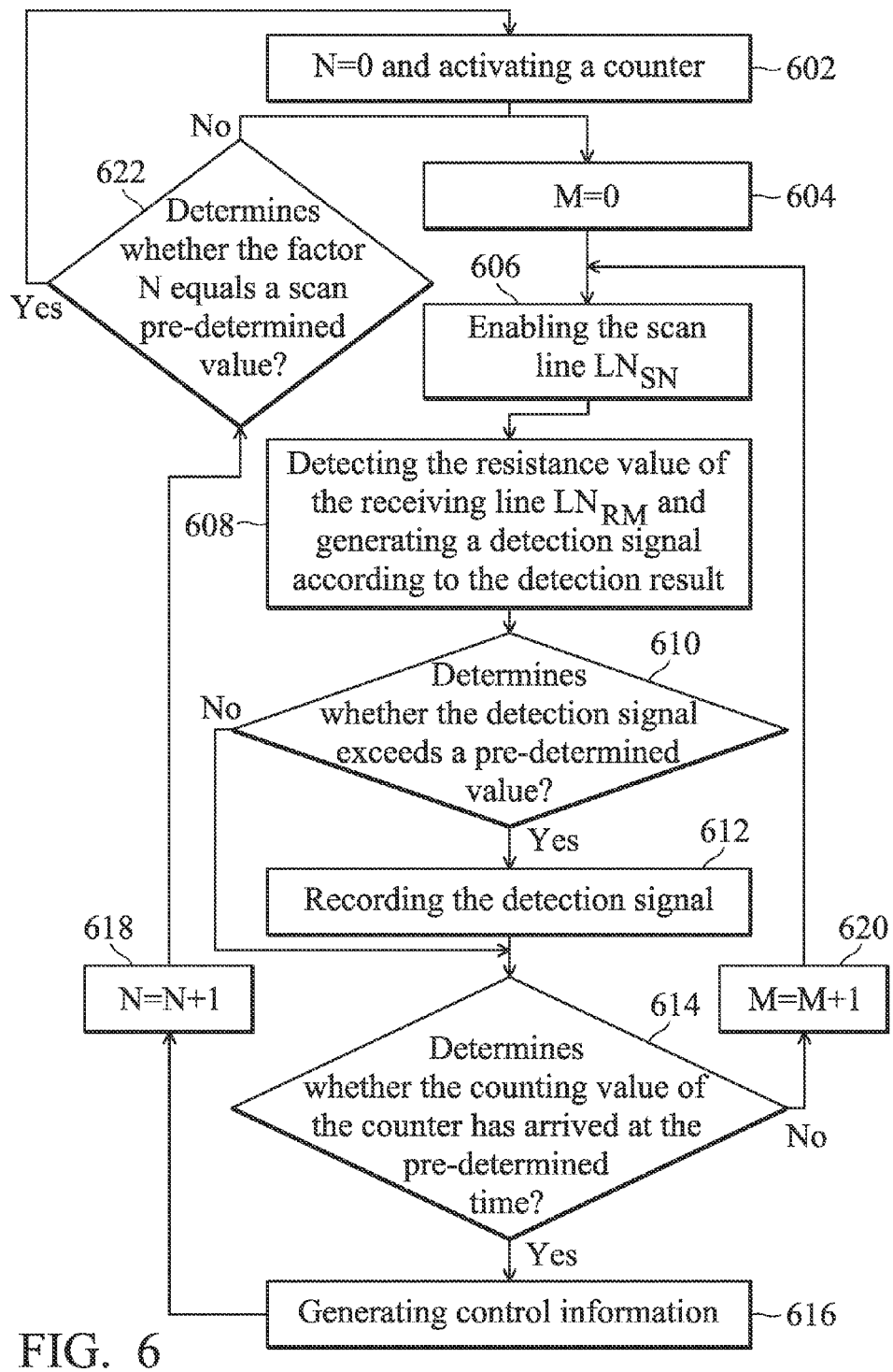
FIG. 6 is a flowchart of an exemplary embodiment of a control method.

FIG. 6 is a flowchart of an exemplary embodiment of a control method. The control method is utilized to determine which key of a keyboard is pressed and provide control information to a host device according to the pressed key. The host device executes a function corresponding to the pressed key. In this embodiment, the keyboard is a resistance-type keyboard. When an object presses a key of the keyboard, the key generates a corresponding resistance value according to a force applied by the object.

First, a factor N is set to 0 in operation 602. The factor N relates to the number of scan lines on the keyboard. In this embodiment, a counter is further activated in operation 602, but the disclosure is not limited thereto. In other embodiments, a counter is not required in operation 602. Next, a factor M is set to 0 in operation 604. The factor M relates to the number of receiving lines of the keyboard.

Next, the scan line $LN_{SN}$ is enabled in operation 606. Since the factor N equals 0, the scan line $LN_{S0}$ is enabled. For clarity, refer to FIG. 3, when the scan line $LN_{S0}$ is enabled, the level of the scan line $LN_{S0}$ is at a high level and other levels of other scan lines $LN_{S1}$~$LN_{S4}$ are at a ground level. The high level exceeds the ground level.

The resistance value of the receiving line $LN_{RM}$ is detected and a detection signal is generated according to the detection result in operation 608. The invention does not limit the kind of detection signal. The detection signal may be a digital signal or an analog signal. In another embodiment, the detection signal is a voltage, current or magnetic signal. Since the keyboard 108 is a resistance-type keyboard, the receiving lines $LN_{R0}$~$LN_{R4}$ corresponding to the scan line $LN_{S0}$ output resistance values no matter what keys are pressed. Refer to FIG. 3, since the factor M is 0, a detection signal is generated according to the resistance value of the receiving line $LN_{R0}$ in operation 608. The key $KY_1$ coupled to the scan line $LN_{S0}$ and the receiving line $LN_{R0}$ provides a corresponding resistance value according to the force applied on the key $KY_1$. When the key $KY_1$ is not pressed, the key $KY_1$ also provides a corresponding resistance value.

Next, it is determined whether the detection signal exceeds a pre-determined value in operation 610. When the detection signal does not exceed the pre-determined value, it means that the key $KY_1$ corresponding to the scan line $LN_{S0}$ and the receiving line $LN_{R0}$ is not pressed. Therefore, operation 614 is executed to determine whether a counting value of the counter has arrived at a pre-determined time. When the detection signal exceeds the pre-determined value, it means that the key $KY_1$ corresponding to the scan line $LN_{S0}$ and the receiving line $LN_{R0}$ is pressed. Therefore, the detection signal is recorded in operation 612.

In operation 614, it is determined whether the counting value of the counter has arrived at the pre-determined time. If the counting value of the counter has not arrived at the pre-determined time, it means that some resistance values of all receiving lines are not detected. Therefore, the factor M adds 1 and operation 606 is executed to detect the resistance value of next receiving line $LM_{R1}$. In other embodiments, the factor M is compared to a receiving pre-determined value to determine whether the resistance values of all receiving lines are detected. Therefore, the operation 614 is replaced with the comparing operation. In this case, the counter is not required in operation 602.

If the counting value of the counter arrives the pre-determined time, it means that resistance values of all receiving lines are detected. Therefore, control information is generated according to the recorded result of operation 612 to the host device in operation 616. If many keys are pressed, many recorded results are generated in operation 612. In one embodiment, the recorded results are integrated into single control information in operation 616. In another embodiment, a lot of control information is provided according to the recorded results in operation 616. In some embodiments, if no key is being pressed, corresponding control information is generated to the host device in operation 616 according to the recorded results of operation 612. Therefore, the host device knows that no key is being pressed according to the corresponding control information.

The host device knows which key is being pressed according to the control information. Therefore, the host device executes a function corresponding to the pressed key. Next, factor N is added 1 in operation 618. Then, it is determined whether the factor N equals a scan pre-determined value in operation 622. If the factor N equals the scan pre-determined value, it means that all scan lines are enabled. Therefore, operation 602 is executed to reset the factor N to 0. When the factor N does not equal the scan pre-determined value, operation 604 is executed to reset the factor M.

The keys of the keyboard generate corresponding resistance values according to the forces applied on the corresponding keys. The resistance values are utilized to generate the corresponding detection signals. The detection signals are compared with a pre-determined value. When one of the detection signals is less than the pre-determined value, it means a user is being careless to press one key. Since the small detection signal is omitted, the ghost key can be avoided. Additionally, the scan lines are successively enabled and the levels of the scan lines which are not enabled are the ground level, the ghost key is also avoided and the accuracy of the keyboard is increased.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An input device providing control information to a host device, comprising:
    a first key coupled a first scan line and a first receiving line,
    a second key coupled a second scan line and the first receiving line,
    a third key coupled the first scan line and a second receiving line, and
    a fourth key coupled the second scan line and the second receiving line, wherein when one of the first to fourth keys is pressed by an object, the pressed one of the first to fourth keys generates a resistance value according to a force applied by the object;
    a division module including a first resistance element coupled between the first receiving line and a first level, and a second resistance coupled between the second receiving line and the first level, the division module receiving the resistance value and generating a voltage level according to the resistance value and the first level; and
    a control module generating the control information according to the voltage level of either one of the first and second receiving lines and providing the control information to the host device to execute a function according to the control information, wherein the first level is a ground level.

2. The input device as claimed in claim 1, wherein the control module compares the voltage level and a pre-determined value, and when the voltage level exceeds the pre-determined value, the control module generates the control information.

3. The input device as claimed in claim 2, wherein when the voltage level is less than the pre-determined value, the control module does not generate the control information.

4. The input device as claimed in claim 1, wherein the control module successively enables the first and the second scan lines.

5. The input device as claimed in claim 4, wherein during a first enabling period, the control module provides a second level to the first scan line and provides the first level to the second scan line, and during a second enabling period, the control module provides the first level to the first scan line and provides the second level to the second scan line.

6. The input device as claimed in claim 5, wherein the second level exceeds the first level.

7. The input device as claimed in claim 6, wherein the control module comprises:

a transmittal unit comprising a plurality of pins, wherein each of the pins is coupled to a corresponding scan line to provide the first level or the second level to the corresponding scan line;

a transformation unit transforming the voltage level to generate a digital signal; and a controller controlling the levels of the pins and comparing the digital signal and a pre-determined value, wherein when the digital signal exceeds the pre-determined value, the controller generates the control information.

8. The input device as claimed in claim 7, wherein when many keys among the first, second, third and fourth keys are pressed, each of the pressed keys generates a resistance values according to the force applied on the corresponding key, at least one of the first and second resistance elements receives the resistance values and generates a plurality of voltage levels according to the resistance values and the first level, and the control module generates the control information according to the voltage levels.

9. The input device as claimed in claim 7, wherein the controller operates according to the first and second levels.

10. A control unit for coupling between a keyboard and a host device, comprising:

a division module generating a voltage level according to a resistance value of a specific key and a first level when an object presses the specific key among first to fourth keys of the keyboard;

the first key coupled between a first scan line and a first receiving line;

the second key coupled between a second scan line and the first receiving line;

the third key coupled between the first scan line and a second receiving line;

the fourth key coupled between the second scan line and the second receiving line;

the division module in including a first resistance element coupled between the first receiving line and the first level and a second resistance element coupled between the second receiving line and the first level; and a control module receiving the voltage level of either one of the first and second receiving lines to generate control information and providing the control information to the host device to execute a function according to the control information, wherein the first level is a ground level.

11. The control unit as claimed in claim 10, wherein the control module compares the voltage level and a pre-determined value, and when the voltage level exceeds the pre-determined value, the control module generates the control information.

12. The control unit as claimed in claim 11, wherein when the voltage level is less than the pre-determined value, the control module does not generate the control information.

13. The control unit as claimed in claim 10, wherein the control module successively enables the first and second scan lines.

14. The control unit as claimed in claim 13, wherein during a first enabling period, the control module provides a second level to the first scan line and provides the first level to the second scan line, and during a second enabling period, the control module provides the first level to the first scan line and provides the second level to the second scan line.

15. The control unit as claimed in claim 14, wherein the second level exceeds the first level.

16. The control unit as claimed in claim 15, wherein the control module comprises:

a transmittal unit comprising a plurality of pins, wherein each of the pins is coupled to one of the first and second scan lines to provide the first or the second level to the corresponding scan line;

a transformation unit transforming the voltage level to a digital signal; and a controller controlling the levels of the pins and comparing the digital signal and a pre-determined value, wherein when the digital signal exceeds the pre-determined value, the controller generates the control information.

17. The control unit as claimed in claim 16, wherein when many keys among the first, second, third, and fourth keys are pressed, each of the pressed keys generates a resistance value according to a force applied on the corresponding key, at least one of the first and second resistance elements receives the resistance values and generates a plurality of voltage levels according to the resistance values and the first level, and the control module generates the control information according to the voltage levels.

18. The control unit as claimed in claim 16, wherein the controller operates according to the first and the second levels.

* * * * *